(12) United States Patent
Yamamoto

(10) Patent No.: US 8,853,672 B2
(45) Date of Patent: Oct. 7, 2014

(54) GALLIUM NITRIDE SUBSTRATE AND EPITAXIAL WAFER

(71) Applicant: Hitachi Cable, Ltd., Tokyo (JP)

(72) Inventor: Shunsuke Yamamoto, Mito (JP)

(73) Assignee: Hitachi Metals, Ltd., Tokyo (JP)

( * ) Notice: Subject to any disclaimer, the term of this patent is extended or adjusted under 35 U.S.C. 154(b) by 0 days.

(21) Appl. No.: 13/794,539

(22) Filed: Mar. 11, 2013

(65) Prior Publication Data

US 2013/0248820 A1 Sep. 26, 2013

(30) Foreign Application Priority Data

Mar. 26, 2012 (JP) ................................. 2012-069353

(51) Int. Cl.
*H01L 29/06* (2006.01)
*H01L 29/20* (2006.01)
*H01L 21/02* (2006.01)

(52) U.S. Cl.
CPC ........ *H01L 29/2003* (2013.01); *H01L 21/0262* (2013.01); *H01L 21/02505* (2013.01); *H01L 21/02458* (2013.01); *H01L 21/02389* (2013.01); *H01L 21/0254* (2013.01); *Y10S 438/962* (2013.01)
USPC .......... 257/14; 257/76; 257/94; 257/E29.168; 438/694; 438/962

(58) Field of Classification Search
CPC ....................................................... H01L 33/06
USPC ......... 257/14, 76, 94, E29.168; 438/694, 962
See application file for complete search history.

(56) References Cited

U.S. PATENT DOCUMENTS

| | | |
|---|---|---|
| 2003/0080345 A1 | 5/2003 | Motoki et al. |
| 2004/0089919 A1 | 5/2004 | Motoki et al. |
| 2011/0121265 A1* | 5/2011 | Ueno et al. ........................ 257/14 |
| 2011/0248281 A1* | 10/2011 | Oshima et al. ................... 257/76 |
| 2012/0049224 A1* | 3/2012 | Mizutani et al. ................. 257/98 |

FOREIGN PATENT DOCUMENTS

| | | |
|---|---|---|
| JP | 2001-322899 A | 11/2001 |
| JP | 2004-269313 A | 9/2004 |
| JP | 3864870 B2 | 1/2007 |

* cited by examiner

*Primary Examiner* — Mark A Laurenzi
(74) *Attorney, Agent, or Firm* — McGinn IP Law Group, PLLC

(57) ABSTRACT

A gallium nitride substrate includes a plurality of physical level differences in a surface thereof. All the physical level differences existing in the surface have a dimension of not more than 4 μm. A relationship of $(H-L)/H \times 100 \leq 80$ is satisfied in all the physical level differences, where H represents a higher value of cathodoluminescence emission intensities of a wavelength corresponding to a bandgap of the gallium nitride substrate, and L represents a lower value of the cathodoluminescence emission intensities, the cathodoluminescence emission intensities being measured in an upper step and a lower step of the physical level difference.

4 Claims, 3 Drawing Sheets

GALLIUM NITRIDE SUBSTRATE AND EPITAXIAL WAFER

The present application is based on Japanese patent application No. 2012-069353 filed on Mar. 26, 2012, the entire contents of which are incorporated herein by reference.

BACKGROUND OF THE INVENTION

1. Field of the Invention

This invention relates to a gallium nitride substrate and an epitaxial wafer using the gallium nitride substrate.

2. Description of the Related Art

As a method of manufacturing a good and large gallium nitride substrate, methods are known, such as a method configured to obtain a nitride substrate by Disclosure Elimination by the Epi-growth with Inverted-Pyramidal Pits (DEEP) method (for example, refer to JP-B-3864870) or Void-Assisted Separation (VAS) method (for example refer to JP-A-2004-269313), and a method configured to obtain a GaN freestanding substrate by thickly growing a single crystal of gallium nitride on a heterogeneous substrate by Hydride Vapor Phase Epitaxy (HVPE) method, and separating it from the heterogeneous substrate.

In the gallium nitride substrate manufactured by the above-mentioned methods, dislocation density is varied from the rear surface toward the front surface in the thickness direction, and lattice constant is varied in the thickness direction, thus the freestanding substrate has warpage. In addition, a film thickness difference of not less than several tens micron meters exists in the gallium nitride substrate due to the fact that the single crystal of gallium nitride is thickly grown. Consequently, polishing treatment for planarizing the front surface side and the rear surface side of the gallium nitride substrate is needed. After the polishing treatment, peripheral processing is applied to the freestanding substrate so as to be shaped in a circular form having a desired diameter. After that, cleaning is carried out so that mirror surface is obtained.

As a method of polishing the gallium nitride substrate, a method configured to polish a substrate by loose grains supplied on a surface plate is known (for example, refer to JP-A-2001-322899). In the above-mentioned method, the substrate is polished such that the grain diameter of loose grain is gradually lessened and polishing speed is gradually reduced.

SUMMARY OF THE INVENTION

However, even if the polishing is carried out such that the grain diameter of loose grain is lessened, polishing speed is reduced and polishing time is prolonged by using the method described in JP-A-2001-322899, it is extremely difficult to prevent physical level differences due to scratch or the like from occurring in the whole surface of the gallium nitride substrate. If an epitaxial growth layer is grown on a surface having physical level differences, even if the dimension of the physical level differences is several nanometers, it may be caused that the epitaxial growth layer is abnormally grown, so that the surface is not planarized. In case of manufacturing an optical device by using the above-mentioned epitaxial wafer, a problem is caused that defect due to decrease in emission intensity is raised so that production yield is reduced.

Accordingly, it is an object of the invention to provide a gallium nitride substrate that is capable of growing an epitaxial growth layer having a good crystalline quality even if the surface has physical level differences. Also, it is another object of the invention to provide an epitaxial wafer that a surface thereof has good flatness by growing the epitaxial growth layer on the above-mentioned gallium nitride substrate.

(1) According to one embodiment of the invention, a gallium nitride substrate comprises:
   a plurality of physical level differences in a surface thereof,
   wherein all the physical level differences existing in the surface have a dimension of not more than 4 μm, and
   wherein a relationship of $(H-L)/H \times 100 \leq 80$ is satisfied in all the physical level differences, where H represents a higher value of cathodoluminescence emission intensities of a wavelength corresponding to a bandgap of the gallium nitride substrate, and L represents a lower value of the cathodoluminescence emission intensities, the cathodoluminescence emission intensities being measured in an upper step and a lower step of the physical level difference.

In the above embodiment (1) of the invention, the following modifications and changes can be made.

(i) All the physical level differences have a dimension of not more than 3 μm.

(ii) All the physical level differences have a dimension of not more than 2 μm.

(2) According to another embodiment of the invention, an epitaxial wafer comprises:
   the gallium nitride substrate according to the above embodiment (1);
   a buffer layer on the gallium nitride substrate; and
   an InGaN quantum well structure including an InGaN quantum well layer on the buffer layer.

Effects of the Invention

According to one embodiment of the invention, a gallium nitride substrate can be provided that is capable of growing an epitaxial growth layer having a good crystalline quality even if the surface has physical level differences. Also, an epitaxial wafer can be provided that a surface thereof has good flatness by growing the epitaxial growth layer on the above-mentioned gallium nitride substrate.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

Embodiments

As the result of earnest investigation of the inventors et al., it has been found that even if physical level differences due to scratches and the like exist in the surface of the gallium nitride substrate, a good epitaxial crystal growth is not always impossible, but if the dimension of the physical level difference is relatively small, and a difference of a cathodoluminescence emission intensity of a wavelength corresponding to a bandgap of the gallium nitride substrate between an upper step and a lower step of the physical level difference is small, it is possible to prevent the crystal on the substrate from abnormally being grown so as to allow the crystal having a flat surface to be grown.

The cathodoluminescence emission intensity is varied dependent on the crystal condition in the measurement place, thus a large difference of the cathodoluminescence emission intensity between the upper step and the lower step of the physical level difference represents that the crystal conditions in the upper step and the lower step are drastically different from each other due to processing strain and the like. It is considered that if the crystal conditions in the upper step and the lower step are drastically different from each other, the crystal is abnormally grown on the physical level difference, and if the crystal conditions in the upper step and the lower step are similar to each other, the crystal is prevented from being abnormally grown even if located on the physical level difference.

Here, the physical level difference means a level difference due to scratches and the like that occurs in the surface of the gallium nitride substrate when polishing treatment or etching treatment are applied to the surface of the substrate. For example, in case of the physical level difference due to a concave portion, the level difference is configured such that the bottom of the concave portion forms the lower step and the surface of the substrates forms the upper step, and in case of the physical level difference due to a convex portion, the level difference is configured such that the surface of the substrates forms the lower step and the top of the convex portion forms the upper step.

Figure 1A:
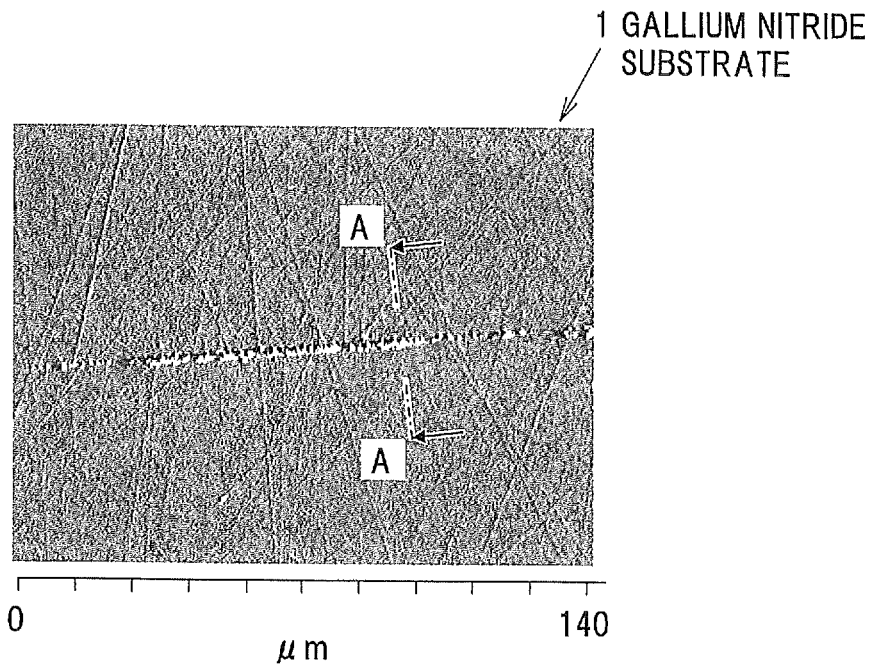
FIG. 1A is a three-dimensional optical profiler image showing scratches of a surface of a gallium nitride substrate according to an embodiment of the invention.
Figure 1B:
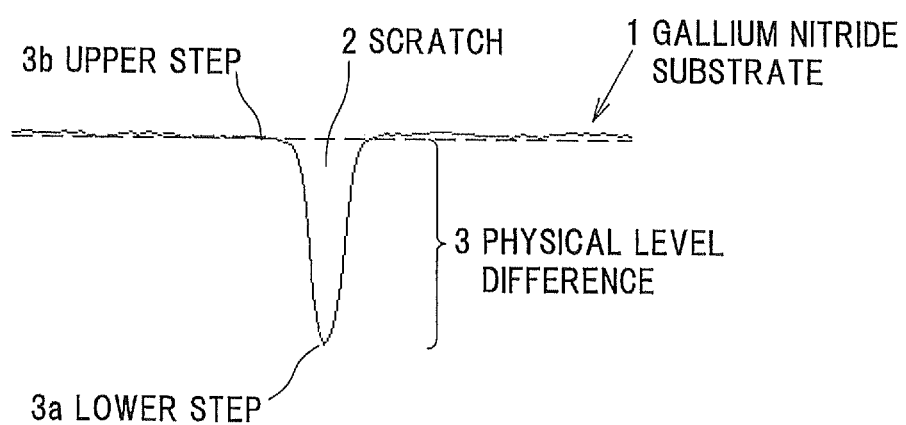
FIG. 1B is a concept illustration schematically showing a cross-section of the gallium nitride substrate taken along the line A-A in FIG. 1A.

FIG. 1A is a three-dimensional optical profiler image showing scratches of a surface of a gallium nitride substrate according to an embodiment of the invention. FIG. 1B is a concept illustration schematically showing a cross-section of the gallium nitride substrate taken along the line A-A in FIG. 1A. FIG. 1B shows a physical level difference 3 due to scratch 2 in the surface of the gallium nitride substrate 1. In the embodiment, the bottom of the scratch 2 is corresponding to a lower step 3a, and the surface of the gallium nitride substrate 1 is corresponding to an upper step 3b. The height from the lower step 3a to the upper step 3b is corresponding to a dimension of the physical level difference 3.

Manufacturing of Gallium Nitride Substrate

Hereinafter, an example of manufacturing process of the gallium nitride substrate by VAS method will be shown. Further, the gallium nitride substrate can be also manufactured by DEEP method.

A GaN crystal is grown on a sapphire substrate as a base substrate by Metal Organic Chemical Vapor Deposition (MOCVD) method so as to form a GaN base layer. Next, a metal Ti thin film is vapor-deposited on the GaN base layer. Next, heat treatment is applied thereto in a mixed airflow of ammonia and hydrogen gas, thereby the metal Ti thin film is nitrides so as to form a TiN thin film having a network structure. In addition, simultaneously with the heat treatment, the GaN base layer is etched so as to form voids. Here, a substrate obtained by the above-mentioned process that includes the GaN base layer including voids and the TiN thin film formed thereon is referred to as a void formed substrate.

Next, by HVPE method that uses GaCl and $NH_3$ as starting materials, after initial nuclei of GaN crystal are formed on the void formed substrate, a GaN crystal film is grown so as to have an arbitrary thickness. Next, after the GaN crystal film grown is separated from the void formed substrate, polishing described below and the like are applied thereto, thereby a freestanding substrate of gallium nitride is obtained.

Here, the freestanding substrate means a substrate configured such that not only it is capable of maintaining its own shape, but also it has strength to the extent that inconvenience is not caused in handling. In order to have the above-mentioned strength, it is preferable that the freestanding substrate is configured to have a thickness at the time of using (namely, the thickness of the freestanding substrate to which polishing, etching and the like are applied after being separated) of not less than 200 μm. In consideration of cleavage easiness and the like after forming an element, it is preferable that the freestanding substrate is configured to have a thickness of not more than 1 mm. If the freestanding substrate is too thick, it becomes difficult to cleave the substrate so that concavity and convexity occur in the cleaved surface. As a result, for example, in case that the substrate is applied to a semiconductor laser, deterioration of device property due to loss of reflection becomes a problem.

In the gallium nitride single crystal epitaxially-grown thickly on the base layer that is a heterogeneous substrate, dislocation density is varied from the rear surface toward the front surface in the thickness direction. Consequently, lattice constant is varied in the thickness direction, thus the gallium nitride substrate obtained has warpage. In addition, the gallium nitride substrate formed by that the single crystal of gallium nitride is thickly grown has a film thickness difference of not less than several tens micron meters in the substrate surface. Due to this, polishing treatment for planarizing the surface of the front side and the surface of the rear side of the gallium nitride substrate is needed.

First, grinding and mechanical polishing of N polar surface, and grinding and mechanical polishing of Ga polar surface of the gallium nitride substrate are carried out successively. Here, as polishing treatment, for example, mechanical polishing by a single sided high speed accurate lapping machine or Chemical Mechanical Polishing (CMP) is carried out.

Next, the gallium nitride substrate is immersed in an etching solution so as to be subjected to a wet etching. Next, the second dry etching of the Ga polar surface is carried out. After that, peripheral processing for shaping the gallium nitride substrate in a circular form having a desired diameter and cleaning are applied thereto.

The gallium nitride substrate obtained suffers damages such as scratches, processing strain in the surface due to the polishing treatment or the etching treatment, so as to have the physical level difference in the surface due to scratches and the like. In the invention, all the physical level differences existing in the surface of the gallium nitride substrate have a dimension of not more than 4 μm, preferably not more than 3 μm, and more preferably not more than 2 μm. If all the physical level differences existing in the surface of the gallium nitride substrate have a dimension of not more than 4 μm, as mentioned above, even if the physical level differences exist, if the crystal conditions in the upper step and the lower step are similar to each other, damages applied to an epitaxial growth layer that is grown subsequently are reduced so that the epitaxial growth layer having a flat surface can be grown.

In addition, a relationship of $(H-L)/H \times 100 \leq 80$ is satisfied in all the physical level differences (wherein H represents a higher value of cathodoluminescence emission intensities of a wavelength corresponding to a bandgap of the gallium nitride substrate, and L represents a lower value of the cathodoluminescence emission intensities, the cathodoluminescence emission intensities being measured in the upper step and the lower step of the physical level difference). $(H-L)/$ H×100≤80 represents a ratio of a difference between H and L relative to H in percentage, and can be used as an index representing a difference of the crystal condition between the upper step and the lower step of the physical level difference, namely a largeness of the processing strain in the part of the physical level difference.

The wavelength corresponding to a bandgap of the gallium nitride crystal at a room temperature (20 degrees C.) is approximately 365 nm, in order to measure the cathodoluminescence emission intensity in the wavelength, for example, the measurement is carried out in the wavelength range of 332.6 to 397.3 nm.

The physical level differences of the surface of the gallium nitride substrate satisfy the above-mentioned relationship, thereby an abnormal growth is prevented when the epitaxial growth layer is grown on the gallium nitride substrate so that the epitaxial growth layer having a flat surface can be obtained. For example, in case that in order to shorten polishing time, polishing treatment that uses loose grains large having a large diameter is carried out, the physical level differences due to scratches and the like are likely to occur in particular, but in case that the physical level differences satisfy the above-mentioned relationship, the epitaxial growth layer having a flat surface can be obtained.

In addition, it is preferable that the gallium nitride substrate has a diameter of not less than 25 mm. The base substrate having a large area is used, thereby the gallium nitride substrate having a large area can be obtained.

Manufacture of Epitaxial Wafer

A GaN buffer layer on the gallium nitride substrate, a quantum well structure including an InGaN quantum well layer on the GaN buffer layer, and an epitaxial growth layer such as a GaN cap layer on the quantum well structure are formed on the Ga polar surface of the gallium nitride substrate obtained, so as to form an epitaxial wafer. The quantum well structure is configured to include, for example, seven InGaN barrier layers and six InGaN quantum well layers, wherein each layer is stacked alternately.

The GaN buffer layer, the quantum well structure and the GaN cap layer are formed by, for example, Metal-Organic Vapor Phase Epitaxy (MOVPE) method using ammonia, trimethyl gallium, and trimethyl indium as starting materials.

In the epitaxial wafer, a photoluminescence intensity (output voltage per 1 mW of laser output) of a wavelength corresponding to a bandgap of the InGaN quantum well layer measured in a region located directly above the physical level difference having a dimension of not more than 3 μm of the surface of the gallium nitride substrate is not less than 1.000 V/mW. The more the flatness of the crystal surface is good, the more the photoluminescence intensity is high, thus this shows that the surface of the epitaxial wafer in a region located directly above the physical level difference having a dimension of not more than 3 μm has a good flatness.

The photoluminescence measurement is carried out according to each region of 0.1 mm long, 0.1 mm wide and 0.01 $mm^2$ area of the surface of the epitaxial wafer. In addition, in order to evaluate the flatness of all the regions of the epitaxial wafer, it is only needed that the measurement is carried out with regard to a remaining region obtained by removing a part of 1 mm from the outer periphery of the epitaxial wafer.

In addition, a photoluminescence of a wavelength corresponding to a bandgap of the InGaN quantum well layer measured in a region located directly above the physical level difference having a dimension of not more than 2 μm is not less than 2.000 V/mW. This shows that the surface of the epitaxial wafer in a region located directly above the physical level difference having a dimension of not more than 2 μm has a further good flatness.

Namely, in case that most of the physical level differences existing in the surface of the gallium nitride substrate have a dimension of not more than 3 μm (for example, all the physical level differences have a dimension of not more than 4 μm), the surface of the epitaxial wafer has a good flatness, in case that all the physical level differences existing in the surface of the gallium nitride substrate have a dimension of not more than 3 μm, the surface of the epitaxial wafer has a further good flatness, and in case that all the physical level differences existing in the surface of the gallium nitride substrate have a dimension of not more than 2 μm, the surface of the epitaxial wafer has a furthermore good flatness.

The epitaxial wafer according to the embodiment is configured such that the surface thereof has a good flatness, thus in case that an optical device is manufactured by using the epitaxial wafer, a reduction in production yield due to lowering of emission intensity can be prevented.

EXAMPLE 1

In Example 1, 25 gallium nitride substrates were formed by VAS method. Next, with regard to each substrate, the physical level difference was measured by using a three-dimensional optical profiler, and 20 evaluation regions were determined with respect to each dimension of the physical level difference. Next, the cathodoluminescence measurement was carried out in each evaluation region of each substrate. Next, an epitaxial growth layer was grown on each gallium nitride substrate so as to form a quantum well structure, thereby an epitaxial wafer was obtained. Next, the photoluminescence measurement was carried out with respect to each epitaxial wafer, an average measurement value in each evaluation region was obtained, and the flatness of the surface was evaluated, so as to investigate a relationship with the dimension of the physical level difference and the result of cathodoluminescence measurement. Hereinafter, a concrete process will be explained.

Manufacture of Gallium Nitride Substrate

First, a GaN base layer having a thickness of 500 nm was formed on a sapphire substrate having a diameter of 3.5 inches by MOCVD. Next, Ti having a thickness of 30 nm was deposited on the surface of the GaN base layer, and heat treatment was applied thereto in a mixed airflow of $H_2$ and $NH_3$, at 1000 degrees C., for 30 minutes, so as to form a TiN thin film having a network structure. In addition, simultaneously with the heat treatment, the GaN base layer was etched so as to form voids therein. As a result, a void formed substrate was obtained.

Figure 2:
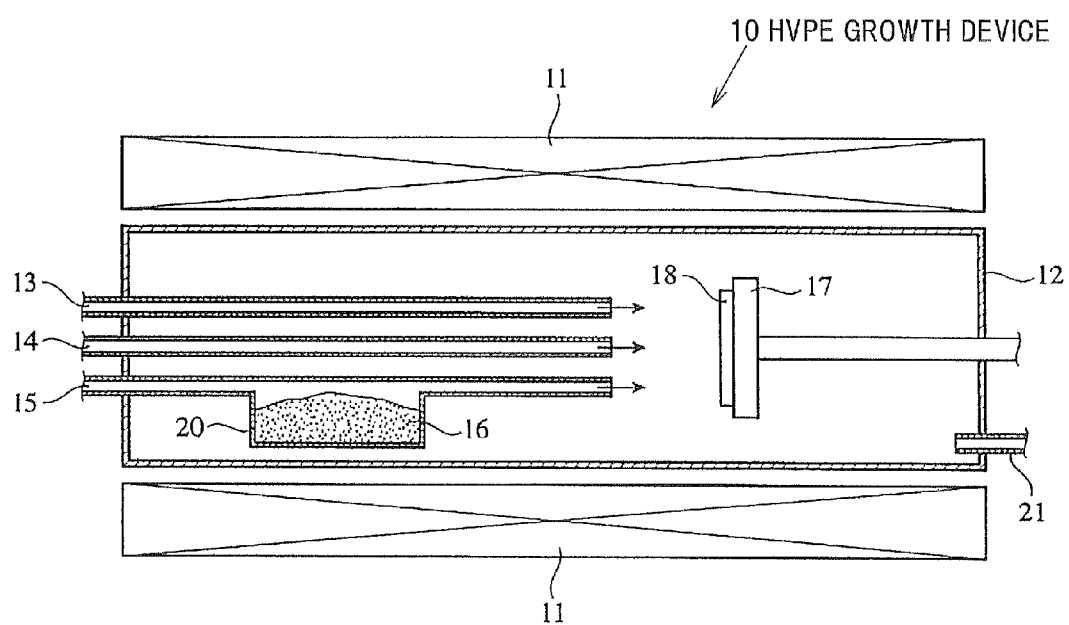
FIG. 2 is a cross-sectional view schematically showing a HVPE growth device according to Example of the invention.

Next, a GaN crystal film was formed on the void formed substrate by using a HVPE growth device 10 shown in FIG. 2. The HVPE growth device 10 includes a heater 11, a reaction container 12, a reaction gas introduction pipe 13, an etching gas introduction pipe 14, a reaction gas introduction pipe 15, a substrate holder 17, a starting material storage room 20, and an exhaust port 21. In the starting material storage room 20 through which the reaction gas introduction pipe 15 passes, metal Ga 16 is housed.

First, the void formed substrate 18 formed was set to the substrate holder 17 in the HVPE growth device 10. Here, as the pressure in the reaction container 12, normal pressure was used, and the substrate temperature of the void formed substrate 18 was raised to 1050 degrees C.

Next, $NH_3$ gas of $5×10^{-2}$ atm was introduced into the reaction container 12 together with $N_2$ gas of $6×10^{-1}$ atm that is a carrier gas from the reaction gas introduction pipe 13, and GaCl gas of $5\times10^{-3}$ atm was introduced into the reaction container 12 together with $N_2$ gas of $2.0\times10^{-1}$ atm that is a carrier gas and $H_2$ gas of $1.0\times10^{-1}$ atm from the reaction gas introduction pipe 15, so as to grow a GaN crystal on the void formed substrate 18 for 20 minutes, and form initial nuclei.

Subsequently, a partial pressure of the GaCl gas and a partial pressure of the $N_2$ gas that is a carrier gas of the $NH_3$ gas were respectively changed to $1.5\times10^{-2}$ atm and $5.85\times10^{-4}$ atm, but the other conditions were not changed, so as to grow the GaN crystal and form a GaN crystal film having a thickness of 800 μm. After that, the GaN crystal film was separated from the void formed substrate 18, so as to obtain a gallium nitride substrate.

Next, grinding of N polar surface of the gallium nitride substrate was carried out by a horizontal surface grinding machine. Here, the grinding was carried out under conditions of used grinding stone: Metal Bond #800, diameter of grinding stone: 150 mm, revolution number of grinding stone: 2500 rpm, feeding speed of grinding stone: 0.2 μm/sec, and processing time of grinding: 20 minutes.

Next, mechanical polishing of N polar surface of the gallium nitride substrate was carried out by a single-sided high speed accurate lapping machine. Here, the mechanical polishing was carried out under conditions of revolution number of surface plate: 150 rpm, pressure: 0.2 MPa, polishing liquid: diamond slurry, supplied amount of polishing liquid: 0.3 L/min, and processing time of polishing: 15 minutes.

Next, grinding of Ga polar surface of the gallium nitride substrate was carried out by a horizontal surface grinding machine. Here, the grinding was carried out under conditions of used grinding stone: Metal Bond #800, diameter of grinding stone: 200 mm, revolution number of grinding stone: 2000 rpm, feeding speed of grinding stone: 0.2 μm/sec, and processing time of grinding: 25 minutes.

Next, mechanical polishing of Ga polar surface of the gallium nitride substrate was carried out by a single-sided high speed accurate lapping machine. Here, the mechanical polishing was carried out under conditions of revolution number of surface plate: 170 rpm, pressure: 0.35 MPa, polishing liquid: diamond slurry, supplied amount of polishing liquid: 0.25 L/min, and processing time of polishing: 15 minutes.

The above-mentioned process was repeated, thereby 25 gallium nitride substrates were prepared. After that, dry etching and wet etching were applied to the 25 gallium nitride substrates under conditions that were different from each other. Hereinafter, details will be explained.

First, a first dry etching was applied to the Ga polar surface of the 25 gallium nitride substrates by a dry etching machine. Table 1 shows the processing time of the first dry etching applied to the 25 gallium nitride substrates. Here, in Table 1, the numbers of (1) to (25) were respectively adopted to the 25 gallium nitride substrates. The other conditions were shared in common by the gallium nitride substrates (1) to (25) such as etching gas: $Cl_2$, electric power: 150 W, flow volume of etching gas: 70 sccm, pressure in etching reaction room: 10 Pa.

Next, a wet etching was applied by immersing the gallium nitride substrates (1) to (25) in a $NH_4OH$ solution that is 90 degrees C. and has concentration of 5%. Table 1 shows the processing time of the wet etching applied to the gallium nitride substrates (1) to (25).

Next, a second dry etching was applied to the Ga polar surface of the gallium nitride substrates (1) to (25) by a dry etching machine. Table 1 shows the processing time of the second dry etching applied to the gallium nitride substrates (1) to (25). The other conditions were shared in common by the gallium nitride substrates (1) to (25) such as etching gas: $Cl_2$, electric power: 150 W, flow volume of etching gas: 40 sccm, pressure in etching reaction room: 20 Pa.

TABLE 1

| GaN substrate number | Processing time of first dry etching (minute) | Processing time of wet etching (minute) | Processing time of second dry etching (minute) |
|---|---|---|---|
| (1) | 20 | 8 | 20 |
| (2) | 24 | 11 | 24 |
| (3) | 28 | 14 | 28 |
| (4) | 32 | 17 | 32 |
| (5) | 36 | 20 | 36 |
| (6) | 40 | 23 | 40 |
| (7) | 44 | 26 | 44 |
| (8) | 48 | 29 | 48 |
| (9) | 52 | 32 | 52 |
| (10) | 56 | 35 | 56 |
| (11) | 60 | 38 | 60 |
| (12) | 64 | 41 | 64 |
| (13) | 68 | 44 | 68 |
| (14) | 72 | 47 | 72 |
| (15) | 76 | 50 | 76 |
| (16) | 80 | 53 | 80 |
| (17) | 84 | 56 | 84 |
| (18) | 88 | 59 | 88 |
| (19) | 92 | 62 | 92 |
| (20) | 96 | 65 | 96 |
| (21) | 100 | 68 | 100 |
| (22) | 104 | 71 | 104 |
| (23) | 108 | 74 | 108 |
| (24) | 112 | 77 | 112 |
| (25) | 116 | 80 | 116 |

Measurement of Physical Level Difference

Physical level difference of the surface of the gallium nitride substrates (1) to (25) due to scratches and the like was measured by a three-dimensional optical profiler (manufactured by ZYGO corporation and sold by the trade name of NewView 6200), and 20 evaluation regions d1 to d20 were determined with respect to each dimension of the physical level difference. The evaluation regions are regions configured to evaluate cathodoluminescence measurement values of the gallium nitride substrates and photoluminescence measurement values of the epitaxial wafers. Tables 2, 3 show the dimension of the physical level difference in the 20 evaluation regions d1 to d20 of the gallium nitride substrates (1) to (25).

TABLE 2

| GaN substrate number | Level difference measurement result (nm) | | | | | | | | | |
|---|---|---|---|---|---|---|---|---|---|---|
| | d1 0~200 (nm) | d2 200~400 (nm) | d3 400~600 (nm) | d4 600~800 (nm) | d5 800~1000 (nm) | d6 1000~1200 (nm) | d7 1200~1400 (nm) | d8 1400~1600 (nm) | d9 1600~1800 (nm) | d10 1800~2000 (nm) |
| (1) | 109 | 301 | 506 | 698 | 915 | 1096 | 1295 | 1512 | 1703 | 1903 |
| (2) | 91 | 307 | 507 | 689 | 912 | 1105 | 1314 | 1495 | 1713 | 1891 |
| (3) | 98 | 310 | 514 | 688 | 885 | 1087 | 1309 | 1503 | 1714 | 1913 |
| (4) | 102 | 314 | 512 | 708 | 889 | 1106 | 1287 | 1510 | 1706 | 1906 |
| (5) | 107 | 307 | 511 | 692 | 904 | 1098 | 1305 | 1491 | 1715 | 1905 |

TABLE 2-continued

| GaN substrate number | Level difference measurement result (nm) | | | | | | | | | |
|---|---|---|---|---|---|---|---|---|---|---|
| | d1 0~200 (nm) | d2 200~400 (nm) | d3 400~600 (nm) | d4 600~800 (nm) | d5 800~1000 (nm) | d6 1000~1200 (nm) | d7 1200~1400 (nm) | d8 1400~1600 (nm) | d9 1600~1800 (nm) | d10 1800~2000 (nm) |
| (6) | 92 | 312 | 488 | 706 | 902 | 1103 | 1300 | 1498 | 1687 | 1888 |
| (7) | 92 | 300 | 492 | 693 | 904 | 1102 | 1297 | 1498 | 1693 | 1894 |
| (8) | 111 | 298 | 503 | 709 | 907 | 1099 | 1300 | 1506 | 1710 | 1897 |
| (9) | 92 | 287 | 508 | 692 | 906 | 1113 | 1287 | 1497 | 1713 | 1890 |
| (10) | 101 | 314 | 506 | 715 | 907 | 1098 | 1315 | 1486 | 1707 | 1901 |
| (11) | 111 | 309 | 502 | 689 | 914 | 1114 | 1300 | 1493 | 1702 | 1895 |
| (12) | 105 | 288 | 502 | 713 | 909 | 1099 | 1292 | 1509 | 1702 | 1889 |
| (13) | 97 | 291 | 501 | 686 | 889 | 1086 | 1302 | 1515 | 1693 | 1889 |
| (14) | 110 | 307 | 509 | 691 | 900 | 1101 | 1311 | 1494 | 1691 | 1906 |
| (15) | 97 | 291 | 514 | 690 | 888 | 1086 | 1313 | 1499 | 1696 | 1898 |
| (16) | 104 | 312 | 512 | 700 | 890 | 1092 | 1309 | 1504 | 1705 | 1897 |
| (17) | 98 | 315 | 487 | 697 | 891 | 1100 | 1289 | 1506 | 1685 | 1888 |
| (18) | 102 | 307 | 495 | 691 | 900 | 1089 | 1289 | 1490 | 1709 | 1889 |
| (19) | 102 | 309 | 488 | 705 | 907 | 1095 | 1290 | 1492 | 1708 | 1891 |
| (20) | 96 | 295 | 515 | 708 | 906 | 1088 | 1307 | 1492 | 1693 | 1891 |
| (21) | 101 | 301 | 497 | 712 | 893 | 1091 | 1304 | 1498 | 1713 | 1893 |
| (22) | 112 | 287 | 502 | 703 | 892 | 1100 | 1297 | 1496 | 1709 | 1885 |
| (23) | 86 | 290 | 497 | 708 | 908 | 1111 | 1310 | 1494 | 1695 | 1898 |
| (24) | 87 | 303 | 510 | 698 | 903 | 1085 | 1310 | 1491 | 1709 | 1889 |
| (25) | 88 | 294 | 489 | 691 | 893 | 1085 | 1313 | 1497 | 1704 | 1890 |

TABLE 3

| GaN substrate number | Level difference measurement result (nm) | | | | | |
|---|---|---|---|---|---|---|
| | d11 2000~2200 (nm) | d12 2200~2400 (nm) | d13 2400~2600 (nm) | d14 2600~2800 (nm) | d15 2800~3000 (nm) | d16 3000~3200 (nm) |
| (1) | 2088 | 2309 | 2495 | 2700 | 2890 | 3093 |
| (2) | 2102 | 2308 | 2503 | 2696 | 2910 | 3088 |
| (3) | 2103 | 2290 | 2496 | 2690 | 2905 | 3103 |
| (4) | 2106 | 2294 | 2503 | 2694 | 2908 | 3110 |
| (5) | 2098 | 2311 | 2491 | 2699 | 2885 | 3097 |
| (6) | 2110 | 2304 | 2490 | 2709 | 2908 | 3097 |
| (7) | 2099 | 2287 | 2497 | 2692 | 2911 | 3113 |
| (8) | 2091 | 2289 | 2504 | 2691 | 2898 | 3113 |
| (9) | 2086 | 2293 | 2496 | 2691 | 2899 | 3085 |
| (10) | 2096 | 2310 | 2488 | 2707 | 2911 | 3107 |
| (11) | 2110 | 2307 | 2487 | 2697 | 2907 | 3095 |
| (12) | 2111 | 2289 | 2515 | 2691 | 2907 | 3097 |
| (13) | 2085 | 2290 | 2495 | 2708 | 2890 | 3108 |
| (14) | 2089 | 2311 | 2502 | 2703 | 2908 | 3115 |
| (15) | 2096 | 2291 | 2486 | 2710 | 2914 | 3110 |
| (16) | 2098 | 2298 | 2511 | 2689 | 2891 | 3107 |
| (17) | 2110 | 2296 | 2506 | 2686 | 2888 | 3112 |
| (18) | 2098 | 2297 | 2494 | 2711 | 2898 | 3088 |
| (19) | 2101 | 2288 | 2492 | 2706 | 2898 | 3105 |
| (20) | 2098 | 2310 | 2515 | 2696 | 2910 | 3111 |
| (21) | 2102 | 2311 | 2490 | 2696 | 2894 | 3094 |
| (22) | 2092 | 2311 | 2506 | 2693 | 2903 | 3112 |
| (23) | 2111 | 2295 | 2503 | 2714 | 2907 | 3093 |
| (24) | 2088 | 2311 | 2512 | 2695 | 2913 | 3101 |
| (25) | 2108 | 2314 | 2515 | 2685 | 2915 | 3101 |

| GaN substrate number | Level difference measurement result (nm) | | | |
|---|---|---|---|---|
| | d17 3200~3400 (nm) | d18 3400~3600 (nm) | d19 3600~3800 (nm) | d20 3800~4000 (nm) |
| (1) | 3288 | 3498 | 3686 | 3909 |
| (2) | 3306 | 3503 | 3708 | 3902 |
| (3) | 3286 | 3494 | 3703 | 3891 |
| (4) | 3304 | 3497 | 3709 | 3898 |
| (5) | 3314 | 3488 | 3702 | 3891 |
| (6) | 3296 | 3491 | 3704 | 3902 |
| (7) | 3293 | 3508 | 3707 | 3886 |
| (8) | 3304 | 3497 | 3690 | 3906 |
| (9) | 3295 | 3507 | 3707 | 3903 |
| (10) | 3303 | 3498 | 3688 | 3906 |

TABLE 3-continued

| | | | | |
|---|---|---|---|---|
| (11) | 3315 | 3512 | 3706 | 3898 |
| (12) | 3303 | 3501 | 3714 | 3890 |
| (13) | 3306 | 3500 | 3696 | 3889 |
| (14) | 3286 | 3487 | 3685 | 3885 |
| (15) | 3288 | 3512 | 3699 | 3911 |
| (16) | 3300 | 3495 | 3689 | 3885 |
| (17) | 3295 | 3506 | 3706 | 3885 |
| (18) | 3307 | 3499 | 3690 | 3886 |
| (19) | 3315 | 3494 | 3715 | 3894 |
| (20) | 3298 | 3499 | 3691 | 3904 |
| (21) | 3299 | 3491 | 3688 | 3895 |
| (22) | 3311 | 3485 | 3707 | 3907 |
| (23) | 3293 | 3501 | 3696 | 3891 |
| (24) | 3305 | 3498 | 3707 | 3914 |
| (25) | 3301 | 3509 | 3686 | 3888 |

Cathodoluminescence Measurement

Measurement of the cathodoluminescence emission intensity in the evaluation regions d1 to d20 of the gallium nitride substrates (1) to (25) was carried out. A machine configured such that a device (manufactured by Horiba Ltd. and sold by the trade name of MP-32M) for detecting and dispersing emission spectra obtained by cathodoluminescence is installed in an electron scanning microscope (manufactured by Hitachi High-Technologies Corporation and sold by the trade name of S-3000N) was used for the cathodoluminescence measurement. The measurement was carried out in the wavelength range with a central focus on the wavelength of 365 nm corresponding to the bandgap of the gallium nitride crystal, while accelerating voltage of electron was set to 5 kV.

Tables 4, 5 show values of $(H-L)/H \times 100$ in the evaluation regions d1 to d20 of the gallium nitride substrates (1) to (25), wherein H and L respectively represent a higher value and a lower value of the cathodoluminescence emission intensities of a wavelength corresponding to the bandgap of the gallium nitride crystal, the cathodoluminescence emission intensities being measured in the upper step and the lower step of the physical level difference.

TABLE 4

| GaN substrate number | Cathodoluminescence measurement $(H - L)/H \times 100$ (%) | | | | | | | | | |
|---|---|---|---|---|---|---|---|---|---|---|
| | d1 0~200 (nm) | d2 200~400 (nm) | d3 400~600 (nm) | d4 600~800 (nm) | d5 800~1000 (nm) | d6 1000~1200 (nm) | d7 1200~1400 (nm) | d8 1400~1600 (nm) | d9 1600~1800 (nm) | d10 1800~2000 (nm) |
| (1) | 96 | 96 | 96 | 96 | 96 | 97 | 97 | 97 | 97 | 97 |
| (2) | 95 | 95 | 95 | 95 | 95 | 96 | 96 | 96 | 96 | 96 |
| (3) | 94 | 94 | 94 | 94 | 94 | 95 | 95 | 95 | 95 | 95 |
| (4) | 93 | 93 | 93 | 93 | 93 | 94 | 94 | 94 | 94 | 94 |
| (5) | 92 | 92 | 92 | 92 | 92 | 93 | 93 | 93 | 93 | 93 |
| (6) | 91 | 91 | 91 | 91 | 91 | 92 | 92 | 92 | 92 | 92 |
| (7) | 90 | 90 | 90 | 90 | 90 | 91 | 91 | 91 | 91 | 91 |
| (8) | 88 | 88 | 88 | 88 | 88 | 89 | 89 | 89 | 89 | 89 |
| (9) | 86 | 86 | 86 | 86 | 86 | 87 | 87 | 87 | 87 | 87 |
| (10) | 84 | 84 | 84 | 84 | 84 | 85 | 85 | 85 | 85 | 85 |
| (11) | 82 | 82 | 82 | 82 | 82 | 83 | 83 | 83 | 83 | 83 |
| (12) | 77 | 77 | 77 | 77 | 77 | 78 | 78 | 78 | 78 | 78 |
| (13) | 72 | 72 | 72 | 72 | 72 | 73 | 73 | 73 | 73 | 73 |
| (14) | 67 | 67 | 67 | 67 | 67 | 68 | 68 | 68 | 68 | 68 |
| (15) | 62 | 62 | 62 | 62 | 62 | 63 | 63 | 63 | 63 | 63 |
| (16) | 57 | 57 | 57 | 57 | 57 | 58 | 58 | 58 | 58 | 58 |
| (17) | 52 | 52 | 52 | 52 | 52 | 53 | 53 | 53 | 53 | 53 |
| (18) | 47 | 47 | 47 | 47 | 47 | 48 | 48 | 48 | 48 | 48 |
| (19) | 42 | 42 | 42 | 42 | 42 | 43 | 43 | 43 | 43 | 43 |
| (20) | 37 | 37 | 37 | 37 | 37 | 38 | 38 | 38 | 38 | 38 |
| (21) | 32 | 32 | 32 | 32 | 32 | 33 | 33 | 33 | 33 | 33 |
| (22) | 27 | 27 | 27 | 27 | 27 | 28 | 28 | 28 | 28 | 28 |
| (23) | 22 | 22 | 22 | 22 | 22 | 23 | 23 | 23 | 23 | 23 |
| (24) | 17 | 17 | 17 | 17 | 17 | 18 | 18 | 18 | 18 | 18 |
| (25) | 12 | 12 | 12 | 12 | 12 | 13 | 13 | 13 | 13 | 13 |

TABLE 5

| GaN substrate number | Cathodoluminescence measurement $(H - L)/H \times 100$ (%) | | | | | |
|---|---|---|---|---|---|---|
| | d11 2000~2200 (nm) | d12 2200~2400 (nm) | d13 2400~2600 (nm) | d14 2600~2800 (nm) | d15 2800~3000 (nm) | d16 3000~3200 (nm) |
| (1) | 98 | 98 | 98 | 98 | 98 | 99 |
| (2) | 97 | 97 | 97 | 97 | 97 | 98 |

TABLE 5-continued

| | | | | | | |
|---|---|---|---|---|---|---|
| (3) | 96 | 96 | 96 | 96 | 96 | 97 |
| (4) | 95 | 95 | 95 | 95 | 95 | 96 |
| (5) | 94 | 94 | 94 | 94 | 94 | 95 |
| (6) | 93 | 93 | 93 | 93 | 93 | 94 |
| (7) | 92 | 92 | 92 | 92 | 92 | 93 |
| (8) | 90 | 90 | 90 | 90 | 90 | 91 |
| (9) | 88 | 88 | 88 | 88 | 88 | 89 |
| (10) | 86 | 86 | 86 | 86 | 86 | 87 |
| (11) | 84 | 84 | 84 | 84 | 84 | 85 |
| (12) | 79 | 79 | 79 | 79 | 79 | 80 |
| (13) | 74 | 74 | 74 | 74 | 74 | 75 |
| (14) | 69 | 69 | 69 | 69 | 69 | 70 |
| (15) | 64 | 64 | 64 | 64 | 64 | 65 |
| (16) | 59 | 59 | 59 | 59 | 59 | 60 |
| (17) | 54 | 54 | 54 | 54 | 54 | 55 |
| (18) | 49 | 49 | 49 | 49 | 49 | 50 |
| (19) | 44 | 44 | 44 | 44 | 44 | 45 |
| (20) | 39 | 39 | 39 | 39 | 39 | 40 |
| (21) | 34 | 34 | 34 | 34 | 34 | 35 |
| (22) | 29 | 29 | 29 | 29 | 29 | 30 |
| (23) | 24 | 24 | 24 | 24 | 24 | 25 |
| (24) | 19 | 19 | 19 | 19 | 19 | 20 |
| (25) | 14 | 14 | 14 | 14 | 14 | 15 |

| | Cathodoluminescence measurement (H − L)/H × 100 (%) | | | |
|---|---|---|---|---|
| GaN substrate number | d17 3200~3400 (nm) | d18 3400~3600 (nm) | d19 3600~3800 (nm) | d20 3800~4000 (nm) |
| (1) | 99 | 99 | 99 | 99 |
| (2) | 98 | 98 | 98 | 98 |
| (3) | 97 | 97 | 97 | 97 |
| (4) | 96 | 96 | 96 | 96 |
| (5) | 95 | 95 | 95 | 95 |
| (6) | 94 | 94 | 94 | 94 |
| (7) | 93 | 93 | 93 | 93 |
| (8) | 91 | 91 | 91 | 91 |
| (9) | 89 | 89 | 89 | 89 |
| (10) | 87 | 87 | 87 | 87 |
| (11) | 85 | 85 | 85 | 85 |
| (12) | 80 | 80 | 80 | 80 |
| (13) | 75 | 75 | 75 | 75 |
| (14) | 70 | 70 | 70 | 70 |
| (15) | 65 | 65 | 65 | 65 |
| (16) | 60 | 60 | 60 | 60 |
| (17) | 55 | 55 | 55 | 55 |
| (18) | 50 | 50 | 50 | 50 |
| (19) | 45 | 45 | 45 | 45 |
| (20) | 40 | 40 | 40 | 40 |
| (21) | 35 | 35 | 35 | 35 |
| (22) | 30 | 30 | 30 | 30 |
| (23) | 25 | 25 | 25 | 25 |
| (24) | 20 | 20 | 20 | 20 |
| (25) | 15 | 15 | 15 | 15 |

Tables 4, 5 show that in accordance with increase in the dry etching time and the wet etching time, the value of (H−L)/H× 100 is reduced. It is considered that this is due to the fact that in accordance with increase in the dry etching time and the wet etching time, the processing strain in the surface of the gallium nitride substrate is reduced.

Manufacture of Epitaxial Wafer

Figure 3:
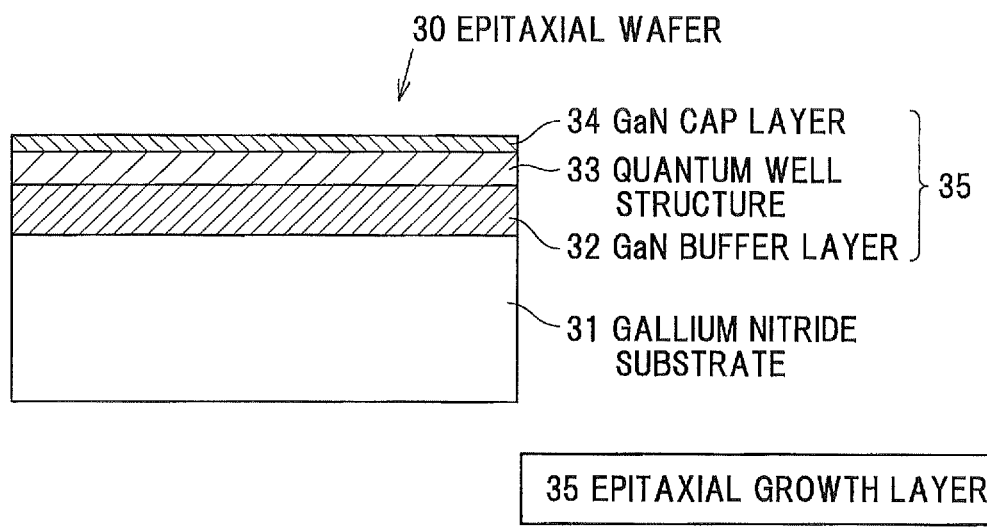
FIG. 3 is a cross-sectional view schematically showing an epitaxial wafer according to Example of the invention.

By MOVPE method, $H_2$ carrier gas, ammonia, trimethyl gallium, and trimethyl indium were supplied on the Ga polar surface of the gallium nitride substrates (1) to (25) heated at 1020 degrees C., so as to form an epitaxial wafer 30 shown in FIG. 3.

The epitaxial wafer 30 includes a gallium nitride substrate 31, and an epitaxial growth layer 35 including a GaN buffer layer 32 on the gallium nitride substrate 31, a quantum well structure 33 on the GaN buffer layer 32 and a GaN cap layer 34 on the quantum well structure 33. The GaN buffer layer 32 is comprised of a GaN crystal film having a thickness of approximately 3000 nm. The quantum well structure 33 has a structure that includes seven InGaN barrier layers comprised of InGaN crystal film having a thickness of 6 nm, and six InGaN quantum well layers comprised of InGaN crystal film having a thickness of approximately 4 nm, wherein each layer is stacked alternately. The GaN cap layer 34 is comprised of GaN crystal film having a thickness of approximately 20 nm.

The epitaxial wafer 30 can be used for an optical device such as a light emission diode. For example, in case that the epitaxial wafer 30 is used for a light emission diode, an electrode is connected to the gallium nitride substrate 31 and the GaN cap layer 34 respectively.

Photoluminescence Measurement

By photoluminescence measurement machine (manufactured by ACCENT Corporation and sold by the trade name of RPM2000), photoluminescence peak intensity (hereinafter, referred to as emission intensity) of a wavelength corresponding to the bandgap of the InGaN quantum well layer in the evaluation regions d1 to d20 of the Ga polar surface of the gallium nitride substrates (1) to (25) was measured.

First, the emission intensity was measured with respect to each region of 0.1 mm long and 0.1 mm wide in a remaining region obtained by removing a region of 1 mm from the outer periphery of the gallium nitride substrate, and from the measurement value obtained, an average emission intensity in a region located directly above each region of the evaluation regions d1 to d20 was obtained. The photoluminescence measurement was carried out under conditions of laser light source: He—Cd laser having wavelength of 325 nm, light receiving slit width: 0.1 mm, and measurement wavelength range: 367.9 to 432.4 nm.

Tables 6, 7 show an average emission intensity in regions located directly above level difference parts d1 to d20.

TABLE 6

| GaN substrate number | Level difference part photoluminescence average emission intensity (Volt/mW) | | | | | | | | | |
|---|---|---|---|---|---|---|---|---|---|---|
| | d1 0~200 (nm) | d2 200~400 (nm) | d3 400~600 (nm) | d4 600~800 (nm) | d5 800~1000 (nm) | d6 1000~1200 (nm) | d7 1200~1400 (nm) | d8 1400~1600 (nm) | d9 1600~1800 (nm) | d10 1800~2000 (nm) |
| (1) | 0.078 | 0.075 | 0.073 | 0.077 | 0.076 | 0.063 | 0.064 | 0.065 | 0.064 | 0.066 |
| (2) | 0.083 | 0.085 | 0.084 | 0.087 | 0.086 | 0.075 | 0.077 | 0.076 | 0.075 | 0.074 |
| (3) | 0.096 | 0.095 | 0.097 | 0.093 | 0.092 | 0.085 | 0.082 | 0.083 | 0.083 | 0.087 |
| (4) | 0.103 | 0.108 | 0.106 | 0.107 | 0.105 | 0.097 | 0.093 | 0.094 | 0.095 | 0.096 |
| (5) | 0.115 | 0.118 | 0.115 | 0.113 | 0.117 | 0.106 | 0.104 | 0.105 | 0.106 | 0.104 |
| (6) | 0.126 | 0.126 | 0.123 | 0.128 | 0.126 | 0.116 | 0.112 | 0.117 | 0.118 | 0.115 |
| (7) | 0.135 | 0.133 | 0.135 | 0.137 | 0.133 | 0.124 | 0.126 | 0.127 | 0.122 | 0.127 |
| (8) | 0.147 | 0.144 | 0.146 | 0.145 | 0.143 | 0.138 | 0.134 | 0.135 | 0.133 | 0.132 |
| (9) | 0.156 | 0.158 | 0.153 | 0.154 | 0.158 | 0.146 | 0.144 | 0.143 | 0.148 | 0.147 |
| (10) | 0.177 | 0.177 | 0.174 | 0.173 | 0.176 | 0.165 | 0.164 | 0.163 | 0.162 | 0.166 |
| (11) | 0.195 | 0.195 | 0.193 | 0.198 | 0.197 | 0.186 | 0.182 | 0.184 | 0.187 | 0.186 |
| (12) | 3.980 | 2.510 | 2.801 | 2.718 | 2.760 | 3.708 | 2.125 | 2.118 | 2.829 | 3.073 |
| (13) | 3.624 | 3.134 | 2.303 | 3.280 | 3.328 | 3.964 | 2.843 | 2.674 | 3.007 | 3.674 |
| (14) | 3.367 | 3.001 | 3.422 | 2.271 | 3.305 | 3.325 | 2.690 | 3.922 | 2.536 | 3.085 |
| (15) | 2.354 | 4.000 | 2.543 | 2.722 | 2.971 | 3.168 | 2.418 | 3.082 | 2.940 | 3.002 |
| (16) | 3.037 | 2.178 | 2.532 | 2.263 | 2.098 | 3.283 | 3.071 | 3.360 | 3.885 | 3.680 |
| (17) | 3.824 | 3.433 | 2.522 | 3.164 | 3.519 | 2.561 | 2.129 | 2.118 | 2.148 | 2.345 |
| (18) | 3.164 | 2.214 | 3.367 | 3.552 | 2.066 | 2.875 | 3.389 | 2.057 | 3.139 | 3.940 |
| (19) | 3.096 | 3.249 | 3.162 | 2.487 | 3.306 | 2.175 | 2.974 | 3.538 | 3.512 | 3.967 |
| (20) | 3.066 | 3.351 | 2.912 | 3.715 | 3.315 | 3.238 | 2.175 | 3.383 | 3.230 | 2.335 |
| (21) | 2.837 | 3.341 | 3.916 | 3.781 | 2.328 | 2.912 | 3.417 | 3.325 | 2.093 | 3.513 |
| (22) | 3.618 | 3.574 | 3.644 | 2.087 | 2.786 | 2.527 | 3.724 | 2.631 | 3.820 | 2.110 |
| (23) | 2.639 | 3.684 | 3.669 | 2.292 | 3.271 | 3.130 | 3.607 | 3.366 | 2.379 | 2.807 |
| (24) | 3.409 | 3.963 | 3.267 | 3.013 | 2.453 | 3.352 | 3.545 | 3.181 | 2.069 | 2.088 |
| (25) | 3.197 | 3.859 | 2.714 | 3.042 | 2.492 | 3.558 | 2.015 | 2.814 | 3.085 | 3.591 |

TABLE 7

| GaN substrate number | Level difference part photoluminescence average emission intensity (Volt/mW) | | | | | |
|---|---|---|---|---|---|---|
| | d11 2000~2200 (nm) | d12 2200~2400 (nm) | d13 2400~2600 (nm) | d14 2600~2800 (nm) | d15 2800~3000 (nm) | d16 3000~3200 (nm) |
| (1) | 0.057 | 0.055 | 0.053 | 0.056 | 0.058 | 0.042 |
| (2) | 0.063 | 0.067 | 0.066 | 0.065 | 0.065 | 0.054 |
| (3) | 0.077 | 0.074 | 0.075 | 0.076 | 0.076 | 0.068 |
| (4) | 0.082 | 0.088 | 0.084 | 0.084 | 0.085 | 0.077 |
| (5) | 0.098 | 0.093 | 0.097 | 0.095 | 0.097 | 0.082 |
| (6) | 0.103 | 0.105 | 0.104 | 0.106 | 0.105 | 0.096 |
| (7) | 0.114 | 0.112 | 0.115 | 0.115 | 0.116 | 0.108 |
| (8) | 0.122 | 0.124 | 0.128 | 0.127 | 0.125 | 0.118 |
| (9) | 0.135 | 0.133 | 0.137 | 0.136 | 0.134 | 0.122 |
| (10) | 0.155 | 0.154 | 0.153 | 0.158 | 0.154 | 0.142 |
| (11) | 0.179 | 0.172 | 0.176 | 0.175 | 0.173 | 0.166 |
| (12) | 1.989 | 1.954 | 1.869 | 1.694 | 1.012 | 0.175 |
| (13) | 1.907 | 1.863 | 1.174 | 1.574 | 1.502 | 0.185 |
| (14) | 1.926 | 1.918 | 1.940 | 1.696 | 1.718 | 0.187 |
| (15) | 1.545 | 1.739 | 1.352 | 1.903 | 1.112 | 0.190 |
| (16) | 1.158 | 1.016 | 1.722 | 1.905 | 1.197 | 0.197 |
| (17) | 1.003 | 1.920 | 1.583 | 1.640 | 1.632 | 0.192 |
| (18) | 1.987 | 1.386 | 1.226 | 1.364 | 1.233 | 0.196 |
| (19) | 1.944 | 1.510 | 1.517 | 1.028 | 1.270 | 0.198 |
| (20) | 1.548 | 1.611 | 1.810 | 1.832 | 1.081 | 0.183 |
| (21) | 1.726 | 1.153 | 1.438 | 1.604 | 1.881 | 0.184 |
| (22) | 1.143 | 1.914 | 1.744 | 1.443 | 1.059 | 0.195 |
| (23) | 1.175 | 1.876 | 1.644 | 1.913 | 1.296 | 0.183 |
| (24) | 1.809 | 1.282 | 1.402 | 1.297 | 1.669 | 0.182 |
| (25) | 1.847 | 1.916 | 1.656 | 1.808 | 1.263 | 0.187 |

TABLE 7-continued

| GaN substrate number | Level difference part photoluminescence average emission intensity (Volt/mW) | | | |
|---|---|---|---|---|
| | d17 3200~3400 (nm) | d18 3400~3600 (nm) | d19 3600~3800 (nm) | d20 3800~4000 (nm) |
| (1) | 0.044 | 0.047 | 0.048 | 0.046 |
| (2) | 0.054 | 0.058 | 0.053 | 0.056 |
| (3) | 0.068 | 0.062 | 0.064 | 0.065 |
| (4) | 0.072 | 0.076 | 0.073 | 0.072 |
| (5) | 0.086 | 0.082 | 0.085 | 0.084 |
| (6) | 0.095 | 0.094 | 0.098 | 0.097 |
| (7) | 0.106 | 0.102 | 0.105 | 0.106 |
| (8) | 0.117 | 0.114 | 0.113 | 0.115 |
| (9) | 0.126 | 0.124 | 0.125 | 0.126 |
| (10) | 0.144 | 0.148 | 0.144 | 0.142 |
| (11) | 0.164 | 0.167 | 0.164 | 0.165 |
| (12) | 0.177 | 0.176 | 0.172 | 0.173 |
| (13) | 0.198 | 0.185 | 0.191 | 0.195 |
| (14) | 0.189 | 0.192 | 0.187 | 0.192 |
| (15) | 0.190 | 0.187 | 0.191 | 0.182 |
| (16) | 0.188 | 0.188 | 0.194 | 0.197 |
| (17) | 0.197 | 0.183 | 0.184 | 0.186 |
| (18) | 0.190 | 0.192 | 0.183 | 0.189 |
| (19) | 0.198 | 0.186 | 0.198 | 0.191 |
| (20) | 0.184 | 0.182 | 0.191 | 0.197 |
| (21) | 0.189 | 0.193 | 0.183 | 0.191 |
| (22) | 0.192 | 0.196 | 0.194 | 0.192 |
| (23) | 0.191 | 0.188 | 0.190 | 0.190 |
| (24) | 0.183 | 0.198 | 0.195 | 0.192 |
| (25) | 0.184 | 0.198 | 0.185 | 0.183 |

According to Tables 6, 7, the emission intensities in regions located directly above the evaluation regions d1 to d20 of the gallium nitride substrates (1) to (11) and regions located directly above the evaluation regions d16 to d20 of the gallium nitride substrates (12) to (25) are as small as not more than 0.200 V/mW, and the emission intensities in regions located directly above the evaluation regions d1 to d15 of the gallium nitride substrates (12) to (25) are as large as not less than 1.000 Volt/mW. Namely, it is recognized that in a region satisfying that the physical level difference is not more than 3 μm, and (H−L)/H×100(%) is not more than 80%, the emission intensity is high, and the surface of the epitaxial wafer is excellent in flatness.

In addition, the emission intensities in regions located directly above the evaluation regions d1 to d10 of the gallium nitride substrates (12) to (25) are as particularly large as not less than 2.000 Volt/mW. Namely, it is recognized that in a region satisfying that the physical level difference is not more than 2 μm, and (H−L)/H×100(%) is not more than 80%, the emission intensity is particularly high, and the surface of the epitaxial wafer is particularly excellent in flatness.

From the above-mentioned results, it is recognized that an epitaxial wafer formed by using a gallium nitride substrate configured such that a relationship of (H−L)/H×100≤80 is satisfied in all the physical level differences existing in the surface, and most of the physical level differences existing in the surface have a dimension of not more than 3 μm (for example, all of the physical level differences existing in the surface have a dimension of not more than 4 μm) can be used as an optical device having a high emission intensity.

In addition, it is recognized that an epitaxial wafer formed by using a gallium nitride substrate configured such that a relationship of (H−L)/H×100≤80 is satisfied in all the physical level differences existing in the surface, and all of the physical level differences existing in the surface have a dimension of not more than 3 μm, preferably not more than 2 μm can be used as an optical device having a further high emission intensity.

In Example 2, gallium nitride substrates (26) to (50) were manufactured such that the above-mentioned conditions of mechanical polishing of the Ga polar surface in the manufacturing process of the gallium nitride substrates (1) to (25) in Example 1 were changed to conditions of pressure: 0.45 MPa, and processing time of polishing: 25 minutes respectively. The other conditions were similar to those used in the manufacture of the gallium nitride substrates (1) to (25).

Measurement of Physical Level Difference

By the same method as that used in Example 1, physical level difference of the surface of the gallium nitride substrates (26) to (50) due to scratches and the like was measured, and 10 evaluation regions d1 to d10 were determined with respect to each dimension of the physical level difference.

In the gallium nitride substrates (26) to (50), the physical level difference that has a dimension of more than 2 μm was not found. It is considered that this is due to the fact that pressure of mechanical polishing of the Ga polar surface was raised and processing time of polishing was prolonged, thereby the substrate surface was further planarized. Consequently, subsequent evaluations were carried out in 10 evaluation regions d1 to d10 that are less than those used in Example 1. Table 8 shows the dimension of the physical level difference in the evaluation regions d1 to d10 of the gallium nitride substrates (26) to (50).

TABLE 8

| GaN substrate number | Level difference measurement result (nm) | | | | | | | | | |
|---|---|---|---|---|---|---|---|---|---|---|
| | d1 0~200 (nm) | d2 200~400 (nm) | d3 400~600 (nm) | d4 600~800 (nm) | d5 800~1000 (nm) | d6 1000~1200 (nm) | d7 1200~1400 (nm) | d8 1400~1600 (nm) | d9 1600~1800 (nm) | d10 1800~2000 (nm) |
| (26) | 84 | 302 | 509 | 718 | 899 | 1120 | 1320 | 1510 | 1713 | 1891 |
| (27) | 119 | 293 | 501 | 716 | 903 | 1113 | 1287 | 1501 | 1706 | 1911 |
| (28) | 125 | 308 | 496 | 716 | 908 | 1118 | 1302 | 1514 | 1690 | 1885 |
| (29) | 49 | 289 | 490 | 680 | 883 | 1101 | 1284 | 1520 | 1702 | 1880 |
| (30) | 47 | 289 | 495 | 703 | 900 | 1096 | 1297 | 1480 | 1692 | 1898 |
| (31) | 34 | 305 | 509 | 686 | 890 | 1107 | 1298 | 1513 | 1718 | 1899 |
| (32) | 50 | 298 | 500 | 682 | 909 | 1090 | 1286 | 1504 | 1715 | 1920 |
| (33) | 23 | 305 | 494 | 695 | 900 | 1110 | 1301 | 1488 | 1687 | 1891 |
| (34) | 20 | 317 | 490 | 703 | 903 | 1106 | 1294 | 1486 | 1688 | 1886 |
| (35) | 104 | 310 | 515 | 681 | 896 | 1117 | 1315 | 1491 | 1681 | 1900 |
| (36) | 37 | 307 | 505 | 680 | 895 | 1119 | 1288 | 1508 | 1706 | 1902 |
| (37) | 30 | 291 | 483 | 694 | 918 | 1094 | 1299 | 1499 | 1717 | 1904 |
| (38) | 47 | 296 | 501 | 709 | 906 | 1115 | 1301 | 1520 | 1680 | 1905 |
| (39) | 40 | 303 | 491 | 699 | 906 | 1112 | 1302 | 1488 | 1714 | 1895 |
| (40) | 76 | 312 | 480 | 697 | 897 | 1106 | 1288 | 1499 | 1714 | 1888 |
| (41) | 60 | 281 | 509 | 707 | 919 | 1080 | 1317 | 1487 | 1696 | 1900 |
| (42) | 137 | 306 | 520 | 686 | 888 | 1101 | 1294 | 1497 | 1693 | 1916 |
| (43) | 107 | 297 | 513 | 697 | 898 | 1109 | 1282 | 1495 | 1719 | 1887 |
| (44) | 51 | 292 | 497 | 700 | 903 | 1097 | 1282 | 1508 | 1690 | 1901 |
| (45) | 76 | 303 | 519 | 691 | 896 | 1085 | 1304 | 1505 | 1719 | 1902 |
| (46) | 27 | 313 | 490 | 697 | 907 | 1108 | 1299 | 1484 | 1701 | 1916 |
| (47) | 109 | 307 | 503 | 709 | 882 | 1092 | 1298 | 1484 | 1703 | 1880 |
| (48) | 100 | 318 | 496 | 682 | 881 | 1115 | 1281 | 1513 | 1696 | 1902 |
| (49) | 1 | 295 | 512 | 715 | 887 | 1100 | 1308 | 1483 | 1693 | 1888 |
| (50) | 38 | 295 | 503 | 719 | 904 | 1117 | 1302 | 1485 | 1701 | 1882 |

Cathodoluminescence Measurement

By the same method as that used in Example 1, the measurement of cathodoluminescence emission intensity in the evaluation regions d1 to d10 of the gallium nitride substrates (26) to (50) was carried out.

Table 9 shows values of (H−L)/H×100 in the evaluation regions d1 to d10 of the gallium nitride substrates (26) to (50), wherein H and L respectively represent a higher value and a lower value of the cathodoluminescence emission intensities of a wavelength corresponding to the bandgap of the gallium nitride crystal, the cathodoluminescence emission intensities being measured in the upper step and the lower step of the physical level difference.

TABLE 9

| GaN substrate number | Cathodoluminescence measurement (H − L)/H × 100 (%) | | | | | | | | | |
|---|---|---|---|---|---|---|---|---|---|---|
| | d1 0~200 (nm) | d2 200~400 (nm) | d3 400~600 (nm) | d4 600~800 (nm) | d5 800~1000 (nm) | d6 1000~1200 (nm) | d7 1200~1400 (nm) | d8 1400~1600 (nm) | d9 1600~1800 (nm) | d10 1800~2000 (nm) |
| (26) | 95 | 95 | 95 | 95 | 95 | 96 | 96 | 96 | 96 | 96 |
| (27) | 94 | 94 | 94 | 94 | 94 | 95 | 95 | 95 | 95 | 95 |
| (28) | 93 | 93 | 93 | 93 | 93 | 94 | 94 | 94 | 94 | 94 |
| (29) | 92 | 92 | 92 | 92 | 92 | 93 | 93 | 93 | 93 | 93 |
| (30) | 91 | 91 | 91 | 91 | 91 | 92 | 92 | 92 | 92 | 92 |
| (31) | 90 | 90 | 90 | 90 | 90 | 91 | 91 | 91 | 91 | 91 |
| (32) | 89 | 89 | 89 | 89 | 89 | 90 | 90 | 90 | 90 | 90 |
| (33) | 87 | 87 | 87 | 87 | 87 | 88 | 88 | 88 | 88 | 88 |
| (34) | 85 | 85 | 85 | 85 | 85 | 86 | 86 | 86 | 86 | 86 |
| (35) | 83 | 83 | 83 | 83 | 83 | 84 | 84 | 84 | 84 | 84 |
| (36) | 81 | 81 | 81 | 81 | 81 | 82 | 82 | 82 | 82 | 82 |
| (37) | 76 | 76 | 76 | 76 | 76 | 77 | 77 | 77 | 77 | 77 |
| (38) | 71 | 71 | 71 | 71 | 71 | 72 | 72 | 72 | 72 | 72 |
| (39) | 66 | 66 | 66 | 66 | 66 | 67 | 67 | 67 | 67 | 67 |
| (40) | 61 | 61 | 61 | 61 | 61 | 62 | 62 | 62 | 62 | 62 |
| (41) | 56 | 56 | 56 | 56 | 56 | 57 | 57 | 57 | 57 | 57 |
| (42) | 51 | 51 | 51 | 51 | 51 | 52 | 52 | 52 | 52 | 52 |
| (43) | 46 | 46 | 46 | 46 | 46 | 47 | 47 | 47 | 47 | 47 |
| (44) | 41 | 41 | 41 | 41 | 41 | 42 | 42 | 42 | 42 | 42 |
| (45) | 36 | 36 | 36 | 36 | 36 | 37 | 37 | 37 | 37 | 37 |
| (46) | 31 | 31 | 31 | 31 | 31 | 32 | 32 | 32 | 32 | 32 |
| (47) | 26 | 26 | 26 | 26 | 26 | 27 | 27 | 27 | 27 | 27 |
| (48) | 21 | 21 | 21 | 21 | 21 | 22 | 22 | 22 | 22 | 22 |
| (49) | 16 | 16 | 16 | 16 | 16 | 17 | 17 | 17 | 17 | 17 |
| (50) | 11 | 11 | 11 | 11 | 11 | 12 | 12 | 12 | 12 | 12 |

Table 9 shows that in accordance with increase in the dry etching time and the wet etching time, the value of (H−L)/H× 100 is reduced. It is considered that similarly to Example 1, this is due to the fact that in accordance with increase in the dry etching time and the wet etching time, the processing strain in the surface of the gallium nitride substrate is reduced.

Manufacture of Epitaxial Wafer

By the same method as that used in Example 1, crystal was epitaxially-grown on the Ga polar surface of the gallium nitride substrates (26) to (50), so as to manufacture an epitaxial wafer having the same configuration as the epitaxial wafer 30 of Example 1.

Photoluminescence Measurement

By the same method as that used in Example 1, a photoluminescence peak intensity (hereinafter, referred to as emission intensity) of a wavelength corresponding to the bandgap of the InGaN quantum well layer in the evaluation regions d1 to d10 of the Ga polar surface of the gallium nitride substrates (26) to (50) was measured. Table 10 shows an average emission intensity in regions located directly above level difference parts d1 to d10.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

Also, the above specific embodiments and Examples does not limit the appended claims. In particular, it should be noted that all of the combinations of features as described in the embodiment and Examples are not always needed to solve the problem of the invention.

What is claimed is:

1. A gallium nitride substrate, comprising:
a plurality of physical level differences in a surface thereof, wherein all the physical level differences existing in the surface have a dimension of not more than 4 μm, and
wherein a relationship of (H−L)/H×100≤80 is satisfied in all the physical level differences, where H represents a higher value of cathodoluminescence emission intensities of a wavelength corresponding to a bandgap of the

TABLE 10

| GaN sub-strate number | Level difference part photoluminescence average emission intensity (Volt/mW) | | | | | | | | | |
|---|---|---|---|---|---|---|---|---|---|---|
| | d1 0~200 (nm) | d2 200~400 (nm) | d3 400~600 (nm) | d4 600~800 (nm) | d5 800~1000 (nm) | d6 1000~1200 (nm) | d7 1200~1400 (nm) | d8 1400~1600 (nm) | d9 1600~1800 (nm) | d10 1800~2000 (nm) |
| (26) | 0.070 | 0.069 | 0.071 | 0.067 | 0.072 | 0.061 | 0.061 | 0.063 | 0.059 | 0.063 |
| (27) | 0.077 | 0.083 | 0.077 | 0.077 | 0.078 | 0.067 | 0.068 | 0.070 | 0.073 | 0.070 |
| (28) | 0.089 | 0.088 | 0.087 | 0.089 | 0.092 | 0.083 | 0.080 | 0.082 | 0.080 | 0.082 |
| (29) | 0.101 | 0.098 | 0.097 | 0.097 | 0.100 | 0.091 | 0.091 | 0.087 | 0.088 | 0.090 |
| (30) | 0.108 | 0.108 | 0.111 | 0.108 | 0.111 | 0.097 | 0.098 | 0.100 | 0.100 | 0.097 |
| (31) | 0.123 | 0.119 | 0.123 | 0.121 | 0.121 | 0.112 | 0.108 | 0.109 | 0.109 | 0.112 |
| (32) | 0.127 | 0.130 | 0.130 | 0.132 | 0.130 | 0.117 | 0.119 | 0.120 | 0.121 | 0.120 |
| (33) | 0.138 | 0.139 | 0.137 | 0.143 | 0.142 | 0.131 | 0.133 | 0.131 | 0.133 | 0.129 |
| (34) | 0.148 | 0.148 | 0.152 | 0.150 | 0.151 | 0.143 | 0.137 | 0.143 | 0.141 | 0.143 |
| (35) | 0.167 | 0.169 | 0.172 | 0.168 | 0.172 | 0.158 | 0.162 | 0.159 | 0.157 | 0.161 |
| (36) | 0.193 | 0.192 | 0.191 | 0.188 | 0.193 | 0.178 | 0.180 | 0.179 | 0.181 | 0.178 |
| (37) | 2.458 | 3.462 | 2.783 | 2.806 | 2.924 | 2.155 | 2.857 | 2.748 | 3.437 | 3.671 |
| (38) | 3.700 | 2.091 | 3.413 | 2.928 | 2.707 | 2.643 | 2.618 | 2.010 | 3.697 | 2.760 |
| (39) | 2.547 | 2.618 | 2.971 | 2.558 | 2.459 | 2.857 | 3.150 | 3.219 | 3.073 | 3.239 |
| (40) | 2.810 | 2.936 | 2.432 | 3.698 | 2.972 | 2.793 | 2.017 | 2.354 | 3.524 | 2.431 |
| (41) | 3.964 | 2.042 | 2.306 | 2.716 | 3.037 | 3.354 | 3.067 | 2.816 | 3.000 | 3.791 |
| (42) | 2.488 | 3.162 | 3.489 | 2.822 | 2.385 | 2.505 | 3.939 | 2.593 | 3.912 | 3.581 |
| (43) | 2.053 | 2.261 | 3.244 | 3.497 | 2.124 | 2.148 | 3.743 | 2.873 | 3.927 | 2.017 |
| (44) | 2.263 | 3.677 | 2.499 | 3.301 | 3.633 | 3.869 | 3.899 | 3.446 | 3.633 | 2.090 |
| (45) | 3.186 | 3.472 | 2.512 | 3.745 | 2.344 | 2.143 | 2.598 | 2.016 | 3.924 | 3.385 |
| (46) | 2.313 | 2.001 | 2.061 | 2.574 | 3.826 | 3.296 | 3.579 | 3.148 | 3.260 | 2.126 |
| (47) | 3.779 | 2.319 | 2.195 | 2.648 | 3.842 | 2.535 | 2.416 | 2.440 | 2.981 | 3.180 |
| (48) | 3.960 | 2.635 | 3.665 | 2.726 | 2.615 | 3.329 | 2.465 | 2.408 | 2.732 | 3.667 |
| (49) | 3.067 | 3.604 | 2.192 | 2.747 | 3.608 | 3.653 | 3.208 | 2.463 | 3.678 | 2.304 |
| (50) | 3.726 | 2.767 | 3.723 | 2.145 | 3.165 | 2.837 | 2.952 | 2.022 | 3.968 | 3.011 |

According to Table 10, the emission intensities in regions located directly above the evaluation regions d1 to d10 of the gallium nitride substrates (26) to (36) are as small as not more than 0.200 V/mW, and the emission intensities in regions located directly above the evaluation regions d1 to d10 of the gallium nitride substrates (37) to (50) are as large as not less than 2.000 Volt/mW. Namely, it is recognized that in a region satisfying that the physical level difference is not more than 2 μm, and (H−L)/H×100(%) is not more than 80%, the emission intensity is high, and the surface of the epitaxial wafer is excellent in flatness.

From the above-mentioned results, it is recognized that an epitaxial wafer formed by using a gallium nitride substrate configured such that a relationship of (H−L)/H×100≤80 is satisfied in all the physical level differences existing in the surface, and all of the physical level differences existing in the surface have a dimension of not more than 2 μm can be used as an optical device having a high emission intensity.

gallium nitride substrate, and L represents a lower value of the cathodoluminescence emission intensities, the cathodoluminescence emission intensities being measured in an upper step and a lower step of the physical level difference.

2. The gallium nitride substrate according to claim 1, wherein all the physical level differences have a dimension of not more than 3 μm.

3. The gallium nitride substrate according to claim 2, wherein all the physical level differences have a dimension of not more than 2 μm.

4. An epitaxial wafer, comprising:
the gallium nitride substrate according to claim 1;
a buffer layer on the gallium nitride substrate; and
an InGaN quantum well structure including an InGaN quantum well layer on the buffer layer.

* * * * *